United States Patent [19]

Thompson

[11] 3,778,893

[45] Dec. 18, 1973

[54] METHOD OF FABRICATING A COHERENT SUPERCONDUCTING OSCILLATOR

[75] Inventor: William A. Thompson, Yorktown Heights, N.Y.

[73] Assignee: International Business Machines Corporation, Armonk, N.Y.

[22] Filed: June 10, 1971

[21] Appl. No.: 151,885

Related U.S. Application Data

[62] Division of Ser. No. 21,640, March 23, 1970, Pat. No. 3,628,184.

[52] U.S. Cl. ................ 29/599, 29/584, 174/DIG. 6, 331/107 S

[51] Int. Cl. .......................... H01v 11/00, H01l 7/18

[58] Field of Search ................... 331/107 S; 29/584, 29/599, DIG. 13; 174/DIG. 6

[56] References Cited

UNITED STATES PATENTS 3,386,050 5/1968 Dayem et al. ............... 331/107 S X 3,600,644 8/1971 Eck............................ 331/107 S X 3,649,356 3/1972 Mullen et al..................... 29/599 X

*Primary Examiner*—Charles W. Lanham
*Assistant Examiner*—D. C. Reiley, III
*Attorney*—Hanifin & Jancin

[57] ABSTRACT

A superconducting oscillator for generating millimeter and infrared radiation and a method for fabricating these oscillators. A Josephson junction (weak link or tunneling juntion) is located between electrodes which furnish DC current to the junction and also define a resonant cavity for electromagnetic radiation from the junction. Thus, an internal cavity is provided and increased power outputs over a wide frequency range are possible. The oscillator is produced by spark erosion between the electrodes at liquid helium temperatures, which forms a very small junction and cavity resonator.

13 Claims, 12 Drawing Figures

METHOD OF FABRICATING A COHERENT SUPERCONDUCTING OSCILLATOR

CROSS REFERENCE TO RELATED APPLICATIONS

This a division of U.S. Pat. Ser. No. 21,640, filed Mar. 23, 1970, now U.S. Pat. No. 3,628,184 which is in turn a continuation-in-part of U.S. Pat. Ser. No. 15,788, filed Mar. 2, 1970, and now abandoned.

BACKGROUND OF THE INVENTION

1. Field of the Invention

This invention relates to coherent oscillators in the millimeter and infrared range, and more particularly to oscillators comprising Josephson junctions in an internal cavity.

2. Description of the Prior Art

Generally, it is difficult to generate electromagnetic radiation having frequencies ranging from far infrared to submillimeters. The prior art devices have had any one of, or a combination of the following problems: difficulty of tuning, low efficiency, instability, lwo power output, and difficulty of fabrication. Prior art oscillators include reflex klystrons, monochromators used in conjunction with optical generators, Gunn effect devices, and Josephson devices in external cavities.

The reflex klystron is an oscillator that utilizes an electron beam which is reflectively contained within a cavity. It is generally expensive and has limited tuning range and requires large voltages for operation. The small cavities required for high frequency operation are very difficult to machine; hence, these devices have a limited frequency range.

The monochromator used in conjunction with an optical generator is, in essence, a filter which selects a particular frequency output of the optical generator. This device has disadvantages in that the optical source usually does not provide coherent radiation and low power outputs are obtained. Even if coherent optical sources are used, the frequencies are generally to high to be within the far infrared-submillimeter range.

The Gunn effect device is one in which travelling high electric field regions are produced in a semiconductor body by an external source. Microwave radiation having a frequency less than about 50 gc is obtainable from such devices, but the percentage of tuning is quite small. Also, the power output from such devices has been limited, although much research is being conducted so that increased power outputs and increased tunability reasonably can be expected.

Another generator in this frequency range is a Josephson junction placed in an external cavity. Such a Josephson device may be, for example, a "strip-line type" junction in which two sheets of superconductor are separated by a dielectric tunnel barrier. DC current through the Josephson junction gives rise to an AC supercurrent frequency, $f=2eV/h$, where V is the voltage across the Josephson junction. This effect was predicted by the British physicist, B.D. Josephson, in Phys. Lett. 1, 251 (1962), and is well known as the AC Josephson effect.

These AC currents exist in the millimeter and submillimeter range and accompany two-particle tunneling. The AC radiation is then coupled into a cavity which connects it to a load of some type.

If the Josephson junction is comprised of two superconducting sheets separated by a dielectric, the device is tuned by the combination of an external magnetic field and electric field. The magnetic field tunes the cavity to match to the AC electromagnetic radiation, while the electric field tunes the junction oscillator. However, this magnetic field is very small, so the presence of stray magnetic fields in the vicinity of the Josephson device tends to isolate the effects of the tuning magnetic field, thus making this an oscillator which is difficult to tune. Also, the characteristic impedence of the typical wave guide structure is in the order of 100 ohms, while the characteristic impedence of such a Josephson tunnel junction is about $10^{-3}$ ohm. Consequently, inefficiency of power output is largely attributed to this impedence mismatch.

If the Josephson junction is a point-contact device, some of the problems described above with reference to a "strip line" Josephson device are eliminated. Such an approach is taken in U.S. Pat. No. 3,386,050, in which a point contact Josephson device is placed at a low impedence portion of an external resonant cavity. This oscillator is voltage tunable, but it is difficult to fabricate for operation at high frequencies. That is, the configuration is a very impractical one for operation above approximately 50 gc. Also, the device tends to have a narrow range of frequencies over which it can be tuned, since it is in essence an impractical configuration for tuning. Another disadvantage is that this device cannot be easily coupled to other solid state devices which are to be used in conjunction with the generator.

Consequently, it is apparent that all of the above listed prior art devices have one or more limitations relating to power output, ease of tunability, complexity of structure, and compatibility with other circuit elements.

It is still a further object of this invention to provide a method for fabricating a coherent oscillator of electromagnetic radiation in the millimeter-infrared range, which method employs conventional solid state technology.

Another object of this invention is to provide a method for fabricating coherent infrared-millimeter oscillators which employs solid state technology to fabricate the entire oscillator in a minimum number of process steps.

SUMMARY OF THE INVENTION

A generator of electromagnetic radiation in the submillimeter-far infrared frequency range is provided by locating a Josephson junction within an internal cavity. In contrast with prior art devices having external cavities, the cavity employed herein is integral with the Josephson junction. In this manner, the cavity dimensions are much smaller than those of previous devices, resulting in increased power outputs and high frequency operation. In addition, it is possible to provide a more nearly continuous sweep across the frequencies of the device, rather than having a device which is tunable only to discrete frequencies determined by the cavity geometry.

It is to be understood that the term "Josephson junction" includes superconducting weak links and Josephson tunneling junctions. Also, by "Josephson current," it is means two particle (pair) tunneling current, which is known to those of skill in this technology.

In a preferred embodiment, a Josephson junction is formed between two electrodes which connect the Josephson junction to a source for providing DC current through the junction. The electrodes also define a resonant cavity for electromagnetic radiation produced by the AC Josephson current resulting from the DC voltage applied to the Josephson junction. In the prior art Josephson junction microwave oscillators, the electrodes providing current to the junction do not define the resonant cavity. In the present invention the cavity, whose width is defined by the electrode width and whose height is usually defined by the skin depth of electromagnetic radiation into the electrodes, is very small, so that increased power outputs and frequencies are available from this device.

In another embodiment, a plurality of Josephson junctions, or an array of such junctions, are formed between two electrodes, so as to provide either a cascaded structure or a phased array. Consequently, increased power outputs are obtained if the radiation from each junction is coupled into the same mode.

From this brief description, it is possible to appreciate the advantages of this oscillator over prior art oscillators. For instance, while it is generally desirable to use large area Josephson junctions (the power generated by the junction depends on its width), prior oscillators did not provide suitable cavities for coupling the generated radiation to the outside (i.e., into circuits typically using this radiation). In the present invention, large area junctions can be used and cavity dimensions can be very closely matched to those dimensions which would provide maximum coupling. Consequently, the present oscillator provides higher power output over a larger frequency range. This advantage is especially important in communications, radar, etc.

Another advantage of the present oscillator is that it can be readily coupled to other solid state components of any size. Whereas prior art oscillators have large cavity dimensions which do not allow lossless coupling to small, solid-state components, the present oscillator has a solid state cavity having dimensions which are very small. This new oscillator can be fabricated on the same wafer as other components, and the radiation generated is easily coupled to other components. In logic circuitry and computer applications, this is a significant advantage.

If a depletion region, such as a Schottky barrier, is provided in the cavity, it is possible to tune the discrete frequency outputs of the cavity. Here, the depletion layer determines the cavity boundary and application of a voltage to vary the width of the depletion layer changes the cavity geometry. This provides a frequency modulation of the output radiation of the Josephson junction at a frequency determined by the voltage of the barrier modulating source. Another way to tune the resonant modes of the cavity is to utilize a piezoelectric material which can be stressed in order to vary its thickness.

Very small Josephson oscillators are fabricated by spark erosion between the electrodes. If spark erosion occurs in a liquid helium environment, a Josephson junction having extremely small dimensions will be formed between the electrodes. This junction can be located anywhere along the electrode surfaces and its position will determine the resonant modes which are excited. If it is desired to provide many Josephson jucntions between the electrodes, spark erosion can be used to provide these junctions at locations determined by the placement of a movable electrode along the surface of a first fixed electrode. After creation of the Josephson junctions, a permanent second electrode is brought into contact with the first electrode, as for example by evaporation.

The electrode mateirals are any electrical conductors including both metals and semiconductors. The Josephson contacts can be formed from any material having superconducting portions in its phase diagram. For instance, if the electrodes are gallium arsenide, superconducting gallium Josephson junctions are created by spark erosion between gallium arsenide electrodes. Of course, the Josephson junctions can be fabricated from metals or semiconductors. A dielectric, which is sometimes needed between metal electrodes, is any dielectric suitable at low temperatures. It includes silicon dioxide and niobium oxide. Another suitable dielectric is the depletion barrier between semiconductors.

Thus, it is apparent that these devices comprise Josephson junctions located in internal cavities, which cavities are defined in the electrodes supplying current to the Josephson junctions. Because solid state technology can be used throughout, it is possible to couple the output of the Josephson junction directly into a solid state wave guide for delivery to other solid state components.

The foregoing and other objects, features, and advantages of the invention will be apparent from the following more particular description of the preferred embodiments of the invention as illustrated in the accompanying drawings.

DESCRIPTION OF THE PREFERRED EMBODIMENTS

Figure 1:
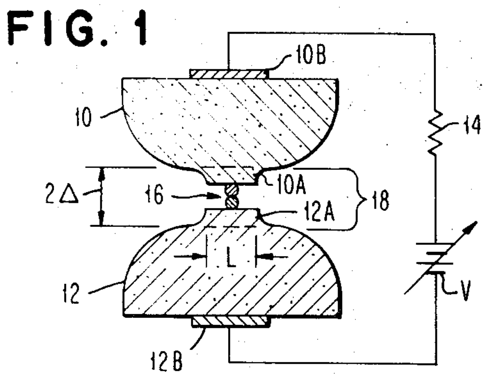
FIG. 1 is a sectional view of a coherent oscillator having an internal resonant cavity.

FIG. 1 illustrates conceptually a coherent oscillator which has an integral resonant cavity. That is, the electrodes which furnish current to the radiation producing source also define the resonant cavity for that source.

In more detail, electrodes 10 and 12 are formed which have protruding neck portions 10A and 12A of width L. These electrodes have metallic contacts 10B and 12B thereon which are connected to a resistor 14 and variable voltage source V. Located between electrodes 10 and 12 is a superconducting Josephson junction 16, illustrated here as two superconducting shperes. Although only two dimensions are shown, it is to be understood that the device has depth, as will be apparent from FIG. 3. Also, it will be readily understood that the cross-section of the electrodes can define a circle, square, rectangle, etc. These things are well within the skill of those familiar with microwave oscillators.

Although electrodes 10 and 12 are shown as being separated, in reality they are in close proximity to one another (this spacing is not critical and could be microns or less; if an insulating depletion barrier is used, the spacing could be zero). Also, although the Josephson junction 16 is shown as two superconducting spheres in contact, in reality there may be a region of superconducting material having one or more weak links (or Josephson tunneling junctions) therebetween. It is only necessary that one junction capable of supporting Josephson current (pair current) therethrough be provided.

When a voltage V is supplied, current flows through Josephson junction 16 and, by the AC Josephson effect, RF currents are established. These currents couple to the cavity 18 which is defined by the electrodes 10 and 12. The total width of the cavity is given by L and the height is given by $2\Delta$, where $\Delta$ is the skin depth of penetration of the electromagnetic radiation into the electrodes. The actual cavity dimensions are left to the designer, as they are not critical. In contrast with the prior art, where a Josephson junction was placed in an external cavity, the electrodes 10 and 12 define the cavity 18 and the structure is a solid state structure. This will become more apparent in the subsequent discussion.

Figure 2:
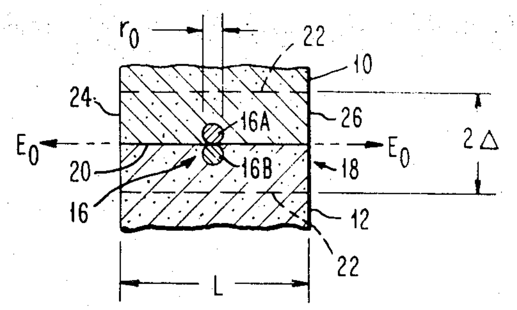
FIG. 2 is an expanded sectional view of the resonant cavity of the oscillator of FIG. 1.

FIG. 2 is an enlarged diagram of the oscillator of FIG. 1, and in particular shows the cavity 18 for RF radiation created by the Josephson effect. Here, the separation between electrodes 10 and 12 is illustrated by the line 20, and the dashed lines 22 represent the upper and lower boundaries of the resonant cavity. The cavity width is L and the height is $2\Delta$, where $\Delta$ is the skin depth penetration of RF radiation into the electrodes 10 and 12. The electromagnetic radiation formed by the AC Josephson effect reflects back and forth between walls 24 and 26 of the cavity 18, due to differences between the dielectric constant of the material forming the electrodes and the dielectric constant of the free space surrounding the cavity. Some radiation exists from the cavity and this is designated $E_o$. In this drawing, the Josephson junction 16 is illustrated schematically as two superconducting spheres 16A and 16B of diameter approximately $r_0$. In order to provide a good cavity, the distance L should be considerably greater than $r_0$ for instance, $L/r_o>10$ is suitable. Making the superconducting region ($r_0$) very small (1,000–3,000A) minimizes the magnetic field dependence and the quasi-particle absorption in the superconducting state. Consequently, absorption of RF energy in the cavity by the superconducting contacts 16A, 16B is minimized. Because the superconducting contacts forming the Josephson junction 16 are generally only a few hundred angstroms in diameter while the distance L is usually 4–20 mils, the junction is only a small part of the cavity and very high output power results. Also, all RF power will be coupled to the Josephson junction(s).

Although the Josephson junction 16 is shown as being approximately in the center of the cavity, it is to be understood that it can be placed anywhere along the distance L. The junction can be entirely within the cavity or on the edge of the cavity. Placement of the junction depends upon the mode to be excited, as will be apparent to those of skill in the art. This will be discussed further with reference to FIGS. 6A, 6B, 6C, and 6D.

Figure 3:
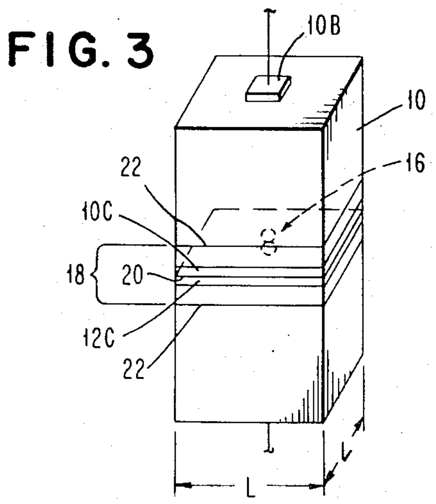
FIG. 3 is a three-dimensional diagram of a coherent oscillator having a Josephson junction within an internal cavity.

FIG. 3 is a three-dimensional diagram of a coherent oscillator having a Josephson junction 16 located within an internal, solid state cavity 18. For clarity, the same reference numerals are used where possible. Here, a small superconducting regions forms the Josephson junction and this junction is embedded within electrodes 10 and 12. The separation between the electrodes is designated 20, while electrodes 10 and 12 are shown as having a square cross-section. It is to be understood that this cross-section could be square, rectangular, circular, etc. Further, current is provided to the Josephson junction by metal contacts 10B, 12B connected to an external source (not shown), in the manner shown in FIG. 1.

Located on either side of the boundary 20 separating electrodes 10 and 12 are depletion layers 10C and 12C which could be Schottky barriers. These barriers are usually present in the semiconductor electrodes due to their large surface state density. If the semiconductor is an ionic semiconductor, then further insulation is used between the electrodes, in the manner illustrated in FIG. 5. The width of these barriers depends on the voltage applied. The lines 22 designate the field penetration depth of the radiation produced by the oscillator.

Depletion layers 10C and 12C are used in order to insure that all DC current will flow through Josephson junction 16, rather than around it. Of course, if an oxide or some other insulator is located around the Josephson junction, this will serve the same purpose.

Because the ratio $r_0/L$ is so small, the disadvantages present when superconducting sheets are used in the Josephson junction are reduced substantially. This means that a better impedance match will result and that the inductance effects of superconducting sheets will not be present.

Figure 4:
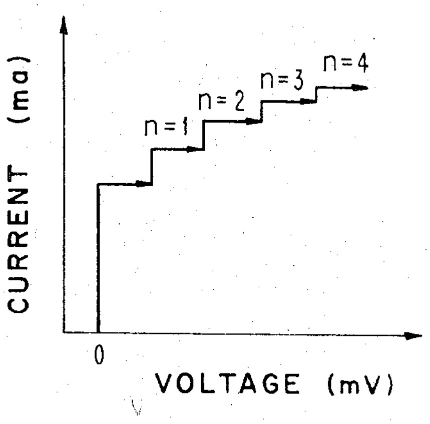
FIG. 4 is a current versus voltage diagram for the coherent oscillators made according to this invention.

FIG. 4 is a current versus voltage diagram for the oscillator of FIGS. 1–3. The frequency of the electromagnetic radiation is a function of the resonant cavity and can be varied by varying the voltage V. The frequency is given by the following relation:

$$\omega_n = \bar{c}n/L = \bar{n}V_n/e$$

where $V_n$ corresponds to the voltage applied across the junction, $\bar{c}$ is the velocity of the electromagnetic wave in the dielectric material forming the cavity, $e$ is electronic charge, and $\bar{n}$ is Planck's Constant divided by $2\pi$.

The steps in the current versus voltage diagram have spacings which are determined by the cavity resonance frequencies. For example, the spacings would be equal for a square cavity having Josephson contacts at the center. This behavior is well explained in an article by D. N. Langenberg, et al., appearing in *Physical Review Letters*, Vol 15, No. 7, August 16, 1965, at pages 294–297.

Figure 5:
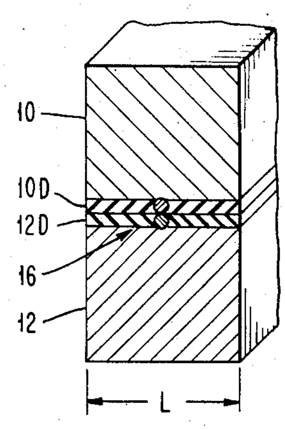
FIG. 5 is a sectional view of a coherent oscillator having metal electrodes with insualting layers thereon.

In FIG. 5 the electrodes 10 and 12 are metals having an insulating coating 10D, 12D thereon, respectively.

Located within the electrode structure is a superconducting region 16 which is the Josephson junction. Although a bias means is not shown, such means will be the same as that shown in FIG. 1. The insulative coatings prevent DC current flow directly between electrodes 10 and 12, insuring that all DC current will flow through the Josephson junction. As before, the cross-section of the cavity can assume any geometrical shape.

A coherent oscillator producing waves of frequency up to 2,000 gc or more can be provided by a Josephson junction — internal cavity structure. If two-particle tunneling above the energy gap of the electrodes is possible without undue noise effects, then frequencies up to 10,000 gc will be obtainable. The materials used to fabricate these oscillators can be chosen from many suitable materials. The table below lists the materials which can be used for the electrodes, Josephson contacts, and insulators surrounding the Josephson contacts, if needed. In this table, any combination can be used.

TABLE

| Electrodes | Josephson Contacts | Insulator |
|---|---|---|
| Any material which conducts current, including metals and semiconductors. | Any material having super conducting properties in its phase diagram, including metals and semiconductors. | Any insulator which functions at low temperatures including for example, $SiO_2$ and $Nb_2O_5$. Also, the depletion barrier of semiconductors is suitable. |

Figure 6A:
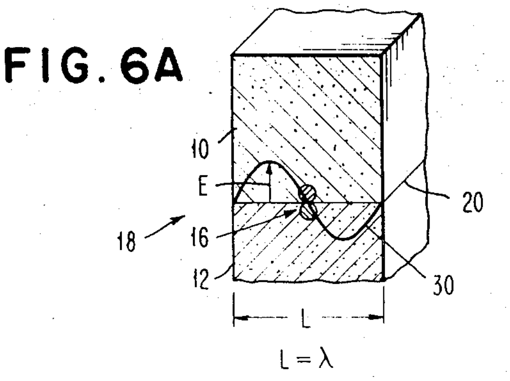
FIGS. 6A, 6B, 6C and 6D (sectional view of FIG. 6C) illustrate various placements of the Josephson junction(s) within the cavity so as to produce various modes of operation.

FIGS. 6A, 6B, 6C and 6D illustrate various placements of the superconducting regions (Josephson junctions) within the cavity. In this discussion, each region is assumed to have only one Josephson junction, so placement of the regions corresponds to placement of the junctions. Placement of the regions containing the Josephson junction(s) determines the modes to be excited and it is within the skill of the art to vary the placement of these regions. In FIG. 6A, the region (junction 16) is located in the center of the cavity 18 so that the length L corresponds to a single wavelength λ. Here, the electromagnetic wave is illustrated schematically by curve 30 having electric field vector E.

Figure 6B:
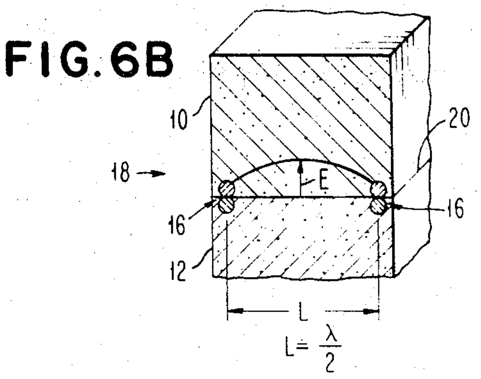

In FIG. 6B, two Josephson junctions 16 are used, each of which is placed near the end of the cavity. This means that the electromagnetic radiation will have a zero electric field vector at the junctions 16 and the length L will correspond to a half-wavelength.

Figure 6C:
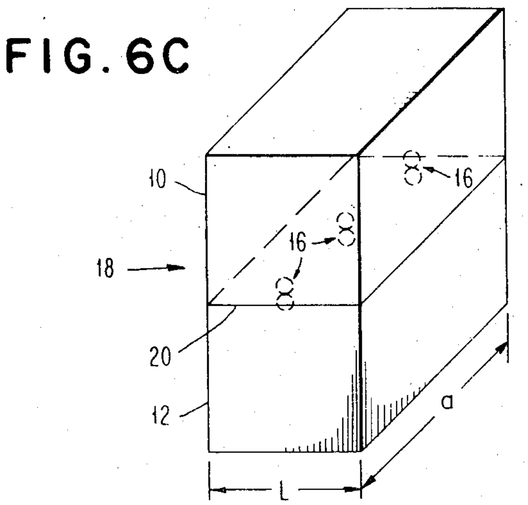
Figure 6D:
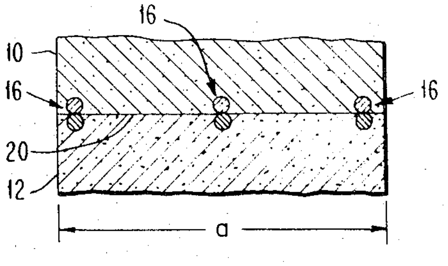

In FIGS. 6C and 6D (sectional view), an oscillator having three Josephson regions (junctions) along the cavity length a is shown. Although bias means are not shown, these would be the same as that in FIG. 1. This is a cascaded structure and each junction will couple energy of the same mode into the resonant cavity 18. In this way, substantial output power is achieved. Also, by selective placement of the junctions 16 along the distance a, different modes can be excited. Again, this is within the skill of the art of a person familiar with cavity resonators.

Figure 7:
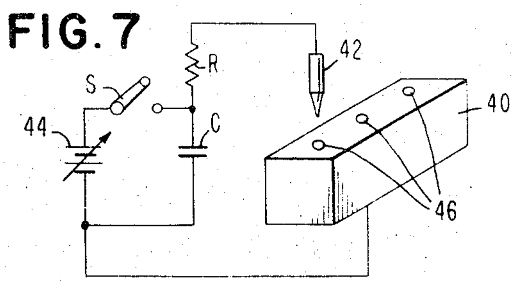
FIG. 7 illustrates the spark erosion technique by which a plurality of Josephson junctions are formed.

FIG. 7 illustrates the spark erosion technique used to form the Josephson junctions. As background for spark erosion, reference is made to IBM Technical Disclosure Bulletin Vol. 12, No. 2 July 1969, at p. 344. In FIG. 7, an electrode 40 (which has been given a desired shape and dimensions according to the cavity desired) is comprised of a material having a superconducting region in its phase diagram. This electrode is electrically connected to another electrode 42 which is in the form of a probe. Voltage source 44 is used to charge capacitance C to a low voltage (1–30V) and thereby to provide a spark discharge between electrodes 40 and 42. This is done in a liquid helium environment so that the rapid vaporization and recrystallization of material between electrodes 40, 42 will form very small regions 46. For instance, if the electrodes 40, 42 are gallium arsenide, the spark erosion process will form very small superconducting regions of gallium. These will be the Josephson junction contacts.

Electrode 42 is moved along the surface of electrode 40 and spark erosions form superconducting regions 46 at desired locations. After deposition of the superconducting regions 46, a second electrode (not shown) is brought into contact with electrode 40, as by evaporation or sputtering onto electrode 40. In this manner an entirely solid state package is formed. If the electrodes are semiconductors then the cavity, which is defined by the electrodes, will be a solid state cavity and it will be quite simple to couple the output radiation to other semiconductor components on the same chip. This is easily done by the use of known components such as semiconductor waveguides. In contrast with the prior art, where the output radiation from an external cavity has to be coupled by a waveguide to other components, all components and the oscillator can be provided on the same semiconductor substrate. The fact that the cavity dimensions are approximately the same as those of other components allows direct coupling to these other components.

Of course, the same electrodes that are used for the spark erosion can be used to define the cavity. In this case, the electrodes are first machined to the proper size, then they are placed in close proximity in a low temperature environment (liquid He is suitable). A voltage (1–30V) between them spark erodes the electrodes at their closest point, and a superconducting region is formed at that point. In order to spark erode at a certain location on the electrode surfaces, the electrodes can be machined or etched so that they are closest at the desired location. If a low voltage (less than 10 volts) is used, then the polarity of the voltage will generally have to be reversed and the voltage applied again in order to spark erode from both electrodes to form a superconducting bridge between the electrodes.

In FIG. 7, if the electrodes are metal, then a dielectric will be deposited on the bottom electrode 40 before the top electrode is evaporated. As explained previously, this insures that the DC current will flow only through the Josephson junction(s), rather than around the junction(s). In the practice of this method, a very suitable electrode probe 42 is niobium, since it can be defined to a small point and has a high melting point. However, the probe electrode can be any conductor. If at least one electrode is a semiconductor, a Schottky barrier will be present in the semiconductor, as explained previously.

Figure 8:
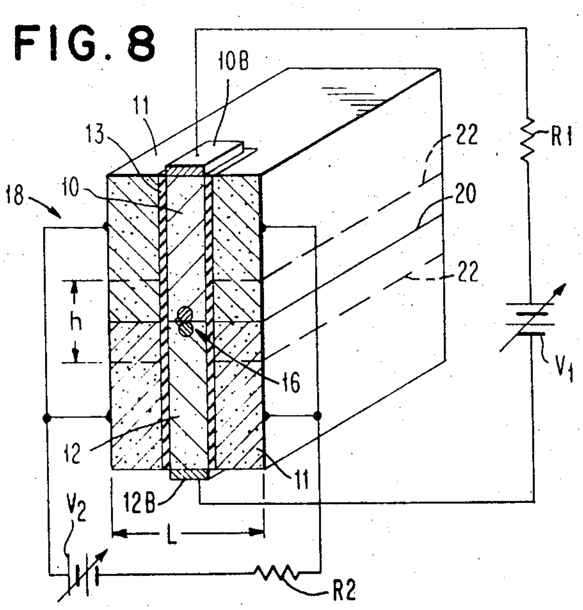
FIG. 8 shows a sectional view of a coherent oscillator according to this invention, whose output can be frequency modulated by the piezoelectric effect.

FIG. 8 illustrates a technique for frequency modulating the radiation output in each cavity mode. Here, the structure is similar to that previously shown, with the addition of a second bias source V2 which is used to vary the length L.

Electrodes 10 and 12 provide current to a Josephson junction 16 (or junctions) which is located within the cavity 18 defined by the electrodes. DC current is provided to the Josephson junction 16 by variable source V1 which is connected via resistor R1 to metal contacts 10B and 12B. Electrodes 10 and 12, together with junction 16, are insulated from the surrounding piezoelectric semiconductor 11 by insulating layer 13. This insures that the electric fields produced by sources V1 and V2 will not interfere with one another. Although piezoelectric semiconductor 11 is shown as two pieces (line 20 is the separation) it is to be understood that a single piece of material could be used.

The height of the resonant cavity is $h$, and the skin depth of electromagnetic radiation is represented by dashed lines 22. Connected across piezoelectric material 11 is a variable voltage source V2. The stress produced in material 11 by application of voltage V2 causes the distance L to change. This in turn will frequency modulate the electromagnetic output radiation at the frequency of modulation of the source V2. Thus, each mode ($n = 1, 2, \ldots$) as illustrated in FIG. 4 will be swept over a frequency range.

Figure 9:
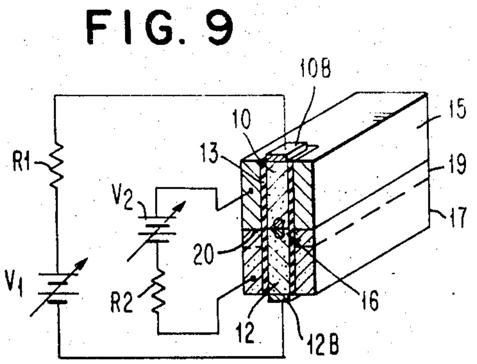
FIG. 9 shows a sectional view of a coherent oscillator according to this invention, whose output can be frequency modulated by varying a depletion layer width.

FIG. 9 illustrates another technique for frequency modulating the resonant cavity outputs. The device is similar to that of FIG. 8, except that one electrode (15) is a metal while the other (17) is a semiconductor (although both electrodes could be semiconductors). A Schottky barrier 19 surrounds the Josephson junction. Electrodes 10 and 12 house a Josephson junction 16 and current is provided to the junction via source V1, which is connected to electrodes 10 and 12 through resistance R1. Schottky barrier depletion layer 19 is formed in electrode 19 on one side of the Josephson junction 16. Connected across this barrier layer is a variable voltage source V2 and a resistance R2. By varying voltage V2, the width of the depletion layer is varied and the cavity dimensions are changed. The cavity height will be determined by the height of the depletion barrier, rather than by the skin depth of electromagnetic penetration as was previously illustrated. Thus, by varying V2, the frequency of each resonant mode is modulated at the frequency of change of voltage V2.

What has been described here is a coherent oscillator for providing waves in the submillimeter—far infrared range. The oscillator is a Josephson junction, or plurality of these junctions, located in an internal solid state cavity. The electrodes which provide current to the Josephson junctions also define the resonant cavity for electromagnetic radiation coupled from these junctions. These junctions are made by spark erosion of very small superconducting contacts and the method enables very small oscillators to be formed. Consequently, the problems associated with prior art devices are in large part overcome and the output power obtained is considerably higher. Also, a greater range of frequencies is available.

Although the invention has been described in terms of an oscillator, it is to be understood that other uses will be readily apparent. For instance, these devices may be used as detectors for measuring frequencies over the frequency range described. Also, arrays of these oscillators may be formed so that a phase array antenna can be provided.

What is claimed is:

1. A method for making coherent superconducting oscillators, comprising the steps of:
positioning two materials, each exhibiting a superconducting phenomenon in a portion of their phase diagrams, and being capable of supporting current flow therethrough, in close proximity in a cryogenic environment;
forming a small superconducting region which exhibits a Josephson current between said materials by applying a sufficient voltage between said materials to vaporize and recrystallize a small portion of said materials.

2. A method of making a coherent oscillator comprising the steps of:
bringing into close proximity in a low temperature environment an electrical probe and one surface of a first electrode, said probe and said first electrode exhibiting a superconducting property in a portion of their respective phase diagrams;
applying a voltage of a first polarity between said probe and said first electrode to cause spark erosion therebetween, said spark erosion forming small superconducting regions on said first electrode surface, said superconducting regions being capable of producing high frequency oscillations;
contacting said first electrode surface and said superconducting regions with a second electrode, said first and second electrode defining a resonant cavity for said high frequency oscillations, and being in electrical contact with said superconducting regions.

3. The method of claim 2, where said second electrode is evaporated onto said first electrode.

4. The method of claim 2, where said second electrode is sputtered onto said first electrode surface.

5. The method of claim 2, where said voltage polarity is reversed and said voltage is applied a second time before said first electrode surface is contacted with said second electrode.

6. The method of claim 2, further including the step of forming an insulating layer on said first electrode surface, before contacting said first electrode with said second electrode, said insulating layer being adjacent said superconducting regions.

7. The method of claim 1, where at least one of said materials is a semiconductor.

8. The method of claim 1, where at least one of said materials is a metal.

9. The method of claim 1, where said voltage is applied between said materials in a liquid helium environment.

10. The method of claim 19, where at least one of said materials is a semiconductor.

11. The method of claim 19, where at least one of said materials is a metal.

12. The method of claim 19, where said low temperature environment is a liquid helium environment.

13. The method of claim 1, where said resonant cavity is comprised of said two materials.

* * * * *

PO-1050
(5/69)

UNITED STATES PATENT OFFICE
CERTIFICATE OF CORRECTION

Patent No. 3,778,893 Dated December 18, 1973

Inventor(s) William A. Thompson

It is certified that error appears in the above-identified patent and that said Letters Patent are hereby corrected as shown below:

Column 10, line 2, after "making" insert --a--;

Column 10, line 3, change "oscillators" to --oscillator--;

Column 10, line 6, delete the comma after diagrams;

Column 10, line 13, change the period after "materials" to a semicolon --;--;

Column 10, after line 13, insert the following paragraph --providing a resonant cavity for said superconducting oscillator.--;

Column 10, line 54, change "19" to --2--;

Column 10, line 56, change "19" to --2--;

Column 10, line 58, change "19" to --2--.

Signed and sealed this 15th day of April 1975.

(SEAL)
Attest:

RUTH C. MASON
Attesting Officer

C. MARSHALL DANN
Commissioner of Patents
and Trademarks